(12) United States Patent
Oh et al.

(10) Patent No.: US 8,187,918 B2
(45) Date of Patent: May 29, 2012

(54) METHODS OF FORMING MULTI-LEVEL CELL OF SEMICONDUCTOR MEMORY

(75) Inventors: Gyu-Hwan Oh, Hwaseong-si (KR);
Hyeung-Geun An, Hwaseongi-si (KR);
Soon-Oh Park, Suwon-si (KR);
Dong-Ho Ahn, Suwon-si (KR);
Young-Lim Park, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 270 days.

(21) Appl. No.: 12/587,772

(22) Filed: Oct. 13, 2009

(65) Prior Publication Data

US 2010/0093130 A1    Apr. 15, 2010

(30) Foreign Application Priority Data

Oct. 13, 2008    (KR) .................. 10-2008-0100174

(51) Int. Cl.
*H01L 21/06*    (2006.01)

(52) U.S. Cl. .......... 438/102; 257/E21.068; 257/E21.585

(58) Field of Classification Search ............. 438/102; 257/E21.068, E21.532, E21.585; 365/46; 216/22
See application file for complete search history.

(56) References Cited

U.S. PATENT DOCUMENTS

| | | | | |
|---|---|---|---|---|
| 7,952,919 B2* | 5/2011 | Liu et al. | ........................ | 365/163 |
| 2005/0112896 A1 | 5/2005 | Hamann et al. | | |
| 2007/0145346 A1* | 6/2007 | Seidl | .................. | 257/3 |
| 2007/0155093 A1 | 7/2007 | Jeong et al. | | |
| 2008/0123390 A1 | 5/2008 | Kim et al. | | |
| 2008/0273378 A1* | 11/2008 | Philipp et al. | ................. | 365/163 |
| 2009/0085023 A1* | 4/2009 | Muralidhar et al. | ............... | 257/3 |
| 2011/0062409 A1* | 3/2011 | Liu et al. | ........................... | 257/5 |

FOREIGN PATENT DOCUMENTS

| | | |
|---|---|---|
| KR | 10-0687757 B1 | 2/2007 |
| KR | 10-2007-0072779 A | 7/2007 |
| KR | 10-2008-0048314 A | 6/2008 |

* cited by examiner

*Primary Examiner* — Caridad Everhart

(74) *Attorney, Agent, or Firm* — Onello & Mello, LLP

(57) ABSTRACT

Provided is a method of forming a semiconductor memory cell in which in order to store two bits or more data in a memory cell, three or more bottom electrode contacts (BECs) and phase-change materials (GST) have a parallel structure on a single contact plug (CP) and set resistances are changed depending on thicknesses (S), lengths (L) or resistivities (ρ) of the three or more bottom electrode contacts, so that a reset resistance and three different set resistances enable data other than in set and reset states to be stored. Also, a method of forming a memory cell in which three or more phase-change materials (GST) have a parallel structure on a single bottom electrode contact, and the phase-change materials have different set resistances depending on composition ratio or type, so that four or more different resistances can be implemented is provided.

11 Claims, 13 Drawing Sheets

METHOD OF FORMING DATA

| data | RESISTANCE | program | REMARKS |
|------|------------|---------|---------|
| D00 | Rset1 | all set | 10~30kΩ |
| D01 | Rset2 | second and third set | 50~80kΩ |
| D10 | Rset3 | third set | 100~130kΩ |
| D11 | Rreset | all set | 1MΩ or higher |

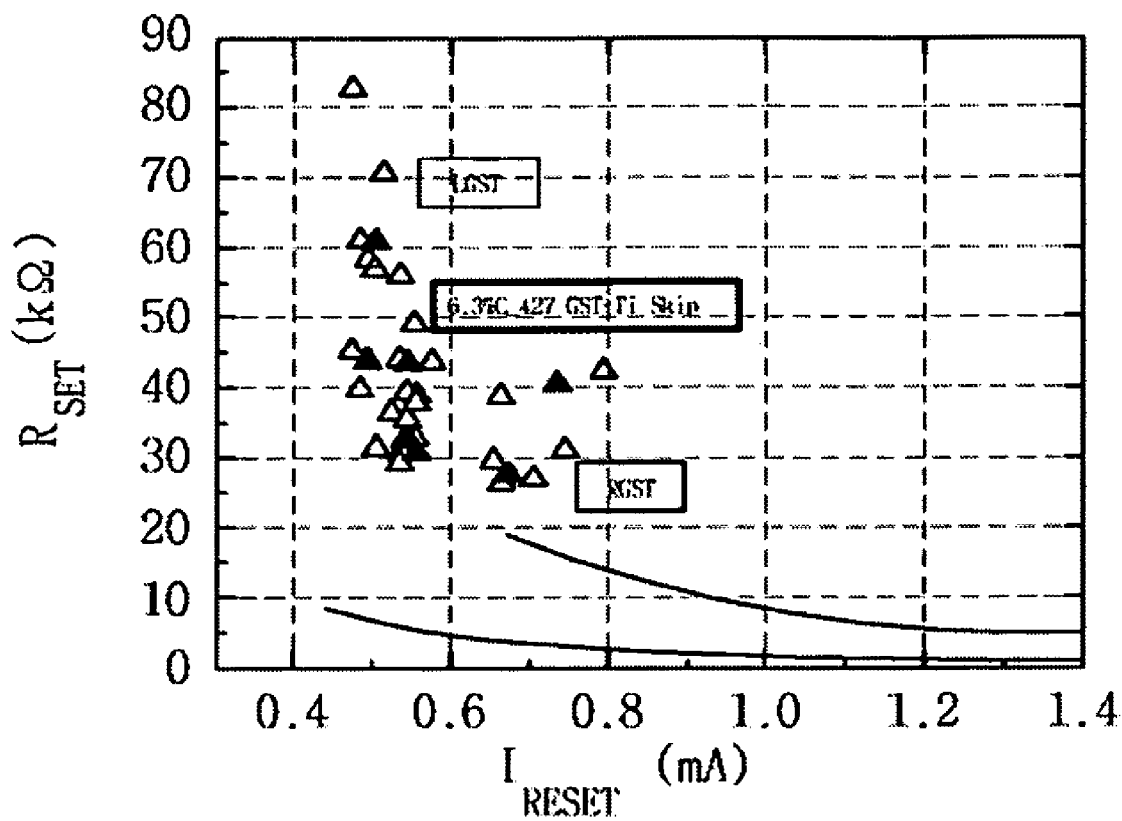

METHODS OF FORMING MULTI-LEVEL CELL OF SEMICONDUCTOR MEMORY

CROSS-REFERENCE TO RELATED APPLICATION

This application claims the benefit of Korean Patent Application No. 10-2008-0100174, filed in the Korean Intellectual Property Office Oct. 13, 2008, the contents of which are hereby incorporated herein by reference in their entirety.

BACKGROUND

1. Field

Exemplary embodiments relate to a non-volatile memory device which has a resistance which is variable depending upon a current or voltage and which need not be refreshed since stored data is retained even when power is cut off, and more particularly, to a method of forming a multi-level cell in which a bottom electrode contact (BEC) or a phase-change material (GST) has three or more parallel structures, so that two or more bits of data are stored in a memory cell.

2. Description of Related Art

A semiconductor memory device requires high operating speed and drivability at low power and a large number of memory cells per unit area, i.e., high integration density. Much research devoted to such devices has been actively progressing, and various types of memory devices have been developed.

In general, a semiconductor memory device includes many memory cells connected to each other by circuitry. In the case of a dynamic random access memory (DRAM), which is a representative memory device, a unit memory cell generally includes a switch and a capacitor. The DRAM exhibits high integration density and high operating speed. However, when power is cut off, all stored data is lost.

A non-volatile memory device, characterized in that it maintains stored data even when power is cut off, exhibits a drastically evolved technique to meet increased demand for devices such as personal digital assistants (PDAs). A flash memory, which is a representative non-volatile memory device, takes advantage of a low-cost silicon process to form most of the current non-volatile memory market. However, the flash memory device has certain drawbacks, such as requiring a relatively high voltage for data storage and limiting the number of repeated data storage. Therefore, research and development on a next generation memory device to overcome such drawbacks are needed.

SUMMARY

Exemplary embodiments provide a method of forming a multi-level cell of a semiconductor memory capable of storing more data in a unit memory cell without increasing the number of memory cells in order to enhance integration density.

Other exemplary embodiments provide a method of forming a multi-level cell of a semiconductor memory in which an intermediate state exists between a reset state and a set state in order to store two or more bits of data in a memory cell, and set resistances are changed depending on the thickness, length or resistivity of a bottom electrode contact, so that four or more resistances are clearly identified.

Still other exemplary embodiments provide a method of forming a multi-level cell of a semiconductor memory in which a difference in set resistance is shown depending on a composition ratio or type of a phase-change material, so that four or more different resistances are implemented.

According to one aspect of the inventive concept, a method of forming a multi-level cell of a semiconductor memory includes: forming three or more bottom electrode contacts (BECs) in parallel on a contact plug; forming three or more phase-change materials (GST) in parallel on the BECs such that the BECs correspond to the phase-change materials, respectively; and forming a top electrode contact (TEC) on the phase-change materials.

Forming the phase-change materials may include removing a part of an upper portion of the BEC, and filling a space left by the removed part with a phase-change material.

Forming the BEC and the phase-change materials in parallel may include forming three or more BECs and three or more phase-change materials in parallel on a single contact plug in a confined structure by an insulator, so that two or more bits of data are stored in a memory cell.

Forming the BEC and the phase-change materials may include forming the BEC and the phase-change materials in a line type, so that a line contact can be made between the single contact plug and the BEC, the BEC and the phase-change materials, and the phase-change materials and the TEC.

Forming the BEC and the phase-change materials may include: forming a dielectric insulating mold, at least a part of which overlaps the contact plug, on the single contact plug; repeatedly depositing a plurality of metal layers and insulating layers on the insulating mold, and etching-back horizontal portions other than vertical portions, so that a plurality of BECs and insulators are formed in parallel in a line type; and recessing an upper portion of the BECs and filling the recessed portions with the phase-change materials.

The thickness, length or resistivity of the BEC may be changed to form three or more set resistances and one reset resistance, so that a multi-level of four or more resistance levels can be formed.

According to another aspect of the inventive concept, a method of forming a multi-level cell of a semiconductor memory includes: forming a plurality of contact holes exposing a source/drain of a transistor or a diode for a respective plurality of memory cells on an insulator; filling the contact holes with a conductive material and forming a plurality of contact plugs; depositing an insulating layer on the contact plugs, and forming a first trench in a longitudinal direction in order to form a dielectric insulating mold in the longitudinal direction of the plurality of contact plugs, wherein the dielectric insulating mold overlaps one part of the contact plugs and the first trench exposing another part of the contact plugs; repeatedly depositing metal layers constituting bottom electrode contacts and insulating layers insulating the bottom electrode contacts from each other on the insulating mold and the trench to a uniform thickness as many times as necessary; etching-back horizontal portions of the metal layers to expose both ends of vertical portions and horizontal portions of the metal layers respectively, and forming a first BEC, a first insulator, a second BEC and a second insulator; depositing the final metal layer connected to the plurality of BECs and the final insulating layer sequentially, and etching-back horizontal portions of the final metal layer and the final insulation layer and forming a third BEC and a third insulator; filling the first trench with a dielectric material, and planarizing a surface thereof; etching the BECs and the dielectric material in a horizontal direction of the plurality of contact plugs to form a second trench, so that a plurality of memory cells are formed; filling the second trench with a dielectric material to insulate the plurality of memory cells from each other; etching-back upper portions of the BECs, and forming recesses; filling the recesses with phase-change materials, and planarizing a surface; and forming a strip-type top electrode contact in a longitudinal direction of the plurality of contacts on the phase-change materials.

According to still aspect of the inventive concept, a method of forming a multi-level cell of a semiconductor memory includes: forming three or more phase-change materials (GST) insulated by a dielectric material in parallel on a bottom electrode contact; and forming a top electrode contact on the phase-change materials.

The bottom electrode contact may be formed in a line type, the three or more phase-change materials may be formed in a line type and may be formed in parallel by repeatedly depositing a phase-change material and an insulator, and the line-type bottom electrode contact may cross the line-type phase-change materials, so that the bottom electrode contact can be in point contact with the phase-change materials.

The phase-change materials may change a set resistance depending on a composition ratio or type of the phase-change materials, so that three or more set resistances and one reset resistance can form a multi-level, and two or more bits of data can be stored in a memory cell.

Forming the phase-change materials in parallel may include: forming a dielectric insulating mold, at least a part of which overlaps the bottom electrode contact, on the line-type bottom electrode contact, wherein the phase-change materials are formed in a direction crossing the line-type bottom electrode contact; repeatedly depositing a plurality of phase-change material layers and insulating layers on the insulating mold; and etching-back horizontal portions other than vertical portions to remove the horizontal portions, so that a plurality of phase-change materials and insulators are formed in parallel in a line-type.

BRIEF DESCRIPTION OF THE DRAWINGS

The foregoing and other features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention. In the drawings, the thickness of layers and regions are exaggerated for clarity.

FIG. 6 is a graph illustrating set resistance and reset current results according to a composition ratio and a type of a phase-change material according to yet another exemplary embodiment.

DETAILED DESCRIPTION OF THE EMBODIMENTS

Figure 1:
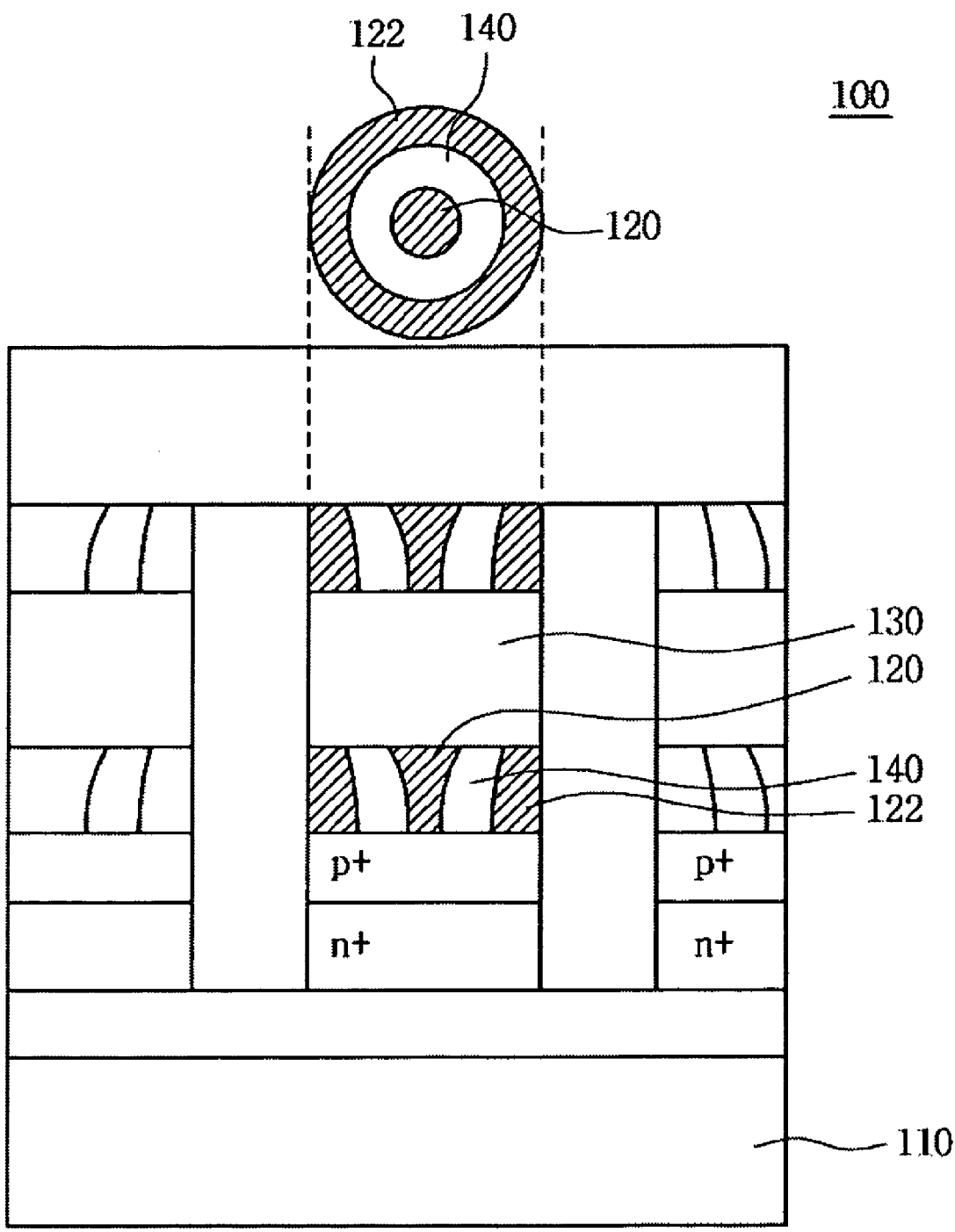
FIG. 1 is a cross-sectional view illustrating a configuration of a semiconductor memory in which a plurality of bottom electrode contacts are disposed in parallel according to one exemplary embodiment.

Various exemplary embodiments will now be described more fully with reference to the accompanying drawings in which some exemplary embodiments are shown. This inventive concept may, however, be embodied in different forms and should not be construed as limited to the embodiments set forth herein. Rather, these embodiments are provided so that this description is thorough and complete and fully conveys the invention to one skilled in the art. It will be understood that although the terms, such as "first," "second" and the like, are used herein to describe various elements, the elements should not be limited by these terms. These terms are only used to distinguish one element from another element.

A method of forming a multi-level cell of a semiconductor memory according to the inventive concept will be described in detail below with reference to the accompanying drawings.

The exemplary embodiment of the inventive concept relates to a non-volatile memory device that does not require a refresh operation to meet demand for high-capacitance and low-power of a semiconductor memory.

The memory devices include a phase change random access memory (PRAM) using a phase-change material, a resistive random access memory (RRAM) using a material of variable resistance characteristics such as a transition metal oxide, and a magnetic random access memory (MRAM) using a ferromagnetic material. The phase-change material, the material of variable resistance characteristics and the ferromagnetic material constituting the memory devices all have the characteristic that they are non-volatile having their resistances changed depending on a current or voltage, and the resistance is retained even when the current or voltage is cut off, and thus a refresh operation is not necessary.

According to the semiconductor memory device, a unit memory cell includes a variable resistance device and a switching device, the variable resistance device is connected between a bit line and the switching device, and the switching device is connected between the variable resistance device and a word line. Depending on the types of variable resistance devices constituting a memory cell, as described above, the memory devices such as PRAM, the RRAM and the MRAM may be constituted.

For example, when a variable resistance device is formed of a phase-change material (Ge—Sb—Te: GST) to change its resistance depending on the temperature, a PRAM may be constituted. When a variable resistance device is formed of an upper electrode, a lower electrode and complex metal oxides between the upper and lower electrodes, a RRAM may be constituted. Further, when a variable resistance device is formed of upper and lower electrodes of a magnetic material and an insulator therebetween, an MRAM may be constituted.

Therefore, while a case in which the variable resistance device is formed of a phase-change material is described in connection with one exemplary embodiment of the inventive concept for the sake of convenience, the description of the exemplary embodiment may be applied to a RRAM and an MRAM as long as the function of the variable resistance device is performed.

Moreover, the switching device may be formed of a diode or transistor. When the switching device is formed of a diode, a variable resistance device and a word line are respectively connected to the ends of the diode. When the switching device is formed of a transistor, the gate of the transistor is connected to a word line, and the drain and the source are respectively connected to the variable resistance device and a reference voltage.

Operations of a unit memory cell in the variable resistance semiconductor memory device of the phase-change material (GST) will be described below.

The PRAM is characterized by a phase-change material, the phase of which is changed between an amorphous state and a crystalline state depending on the temperature. A resistance in an amorphous state is high, and a resistance in a crystalline state is low. Therefore, when a case in which the phase change material (GST) is changed from a crystalline state to an amorphous state is defined as "reset," a case in which the phase change material (GST) is changed from an amorphous state to a crystalline state may be defined as "set."

As a result, a mechanism as a memory device capable of storing data can be enabled. The mechanism will be described in further detail below.

When the phase change material (GST) is heated by current supply to a temperature higher than its melting temperature and then allowed to rapidly cool downs, the above-described "amorphous state" or "reset state" is realized, and data "1" is stored. In contrast, when the phase change material (GST) is heated to a temperature higher than its crystallization temperature and lower than the melting temperature and allowed to cool down slowly, the above-described "crystalline state" or "set state" is realized, and data "0" is stored. In a memory cell, a resistance varies depending on the amorphous volume of a phase-change material (GST). That is, when the memory cell is in an amorphous state, a highest resistance R is exhibited, and when it is in a crystalline state, a lowest resistance is exhibited.

In particular, a multi-level cell (MLC) storing two or more bits of data has an intermediate state between the reset state and the set state. For example, the memory cell has four states depending on falling time of a current pulse. Therefore, in addition to a reset state D11 and a set state D00, the memory cell further includes intermediate states of D10 and D01 depending on the amorphous volume of a phase-change material. Accordingly, the memory device has a mechanism capable of storing data.

However, when a resistance in an intermediate state is controlled to a reset resistance, drift characteristics in which a resistance of a programmed amorphous chalcogenide material is increased over time are exhibited. As a result of these drift characteristics, the ability to function as an MLC is lost. Alternatively, when a current pulse is applied to the memory cell, the amorphous volume of a phase-change material is changed. When such a phenomenon is repeated, the phase-change memory device cannot clearly identify a change in resistance from a change in state according to the amorphous volume of the phase-change material.

In addition, as illustrated in FIG. 1, when a plurality of electrodes are disposed in parallel in a memory cell, an MLC storing two or more bits of data may be implemented.

Referring to FIG. 1, in a memory cell 100 according to one exemplary embodiment, an n-type semiconductor pattern is formed on a semiconductor substrate 110, a p-type semiconductor pattern is formed on the n-type semiconductor pattern, a plurality of bottom electrode contacts (BECs) 120 and 122 are formed on the p-type semiconductor pattern, and a phase-change material (GST) 130 is formed on the BECs 120 and 122 in a strip form. Here, the n-type semiconductor pattern and the p-type semiconductor pattern constitute a cell diode. The BECs 120 and 122 form a plurality of patterns in which a plurality of electrodes overlap in parallel from a center to an outer periphery with an insulator 140 interposed therebetween, in the form of an annual ring.

Therefore, a resistance is changed according to resistivities or cross-sectional areas of the plurality of BEC patterns. As a result, a current that is transferred through the diode flows through the BEC patterns and a plurality of data D00, D01, D10 and D11 can be stored.

However, although the BEC pattern forms a contact structure in an annual ring form, and the plurality of BEC patterns are connected in parallel to each other, since the phase-change material is integrally formed in a cylindrical or strip form, in particular, program volumes in the phase-change material overlap.

According to another exemplary embodiment, an MLC in which a phase-change material (GST) has a resistance that is not changed over time and program volumes do not overlap is provided.

Figure 2:
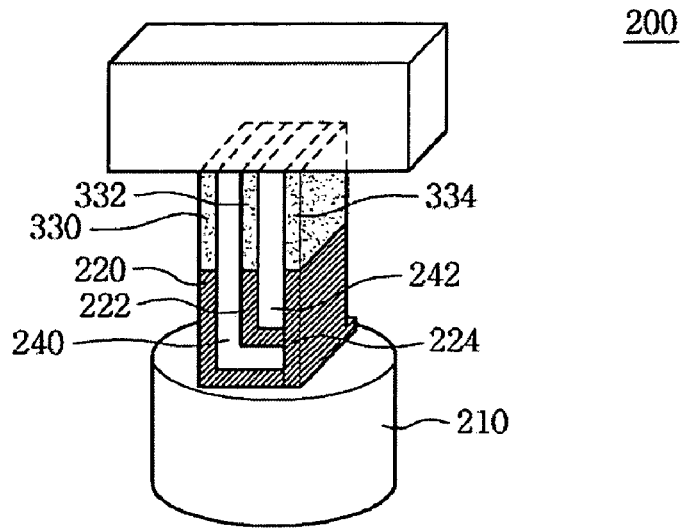
FIG. 2 is a perspective view illustrating a configuration of a semiconductor memory in which a plurality of bottom electrode contacts and a plurality of phase-change materials are disposed in parallel according to another exemplary embodiment.

As illustrated in FIG. 2, a memory cell 200 according to another exemplary embodiment includes three or more BECs 220, 222 and 224 and three or more phase-change materials (GST) 330, 332, 334 which are formed in parallel in a confined structure, on a single contact plug 210. Therefore, a reset resistance Rreset1 and three different set resistances Rset1, Rset2 and Rset3 result in four or more different resistances in total.

Furthermore, since the BECs 220, 222 and 224 and the phase-change materials (GST) 330, 332, 334 are formed in a line type, a line contact is formed between the single contact plug and the electrode contact, between the BEC and the phase change material, and between the phase-change material and the upper electrode contact, and thus program volumes do not overlap between the phase-change materials, and a difference in the resistances is clearly identified.

The difference in resistance is determined by various factors. For this purpose, since the set resistance is changed depending on the thickness (S), length (L), or resistivity ($\rho$) of the BEC, BECs having different thicknesses, lengths, or resistivities are disposed on the single contact plug 210.

For example, as illustrated in FIG. 2, since the length L1 of the first BEC 220, the length L2 of the second BEC 222, and the length L3 of the third BEC 224 have the relationship L1>L2>L3, according to a formula of R=$\rho$L/S (wherein $\rho$ denotes resistivity, L denotes length, and S denotes thickness), the resistance is decreased in the order of the first BEC 220, the second BEC 222 and the third BEC 224.

Figure 3:
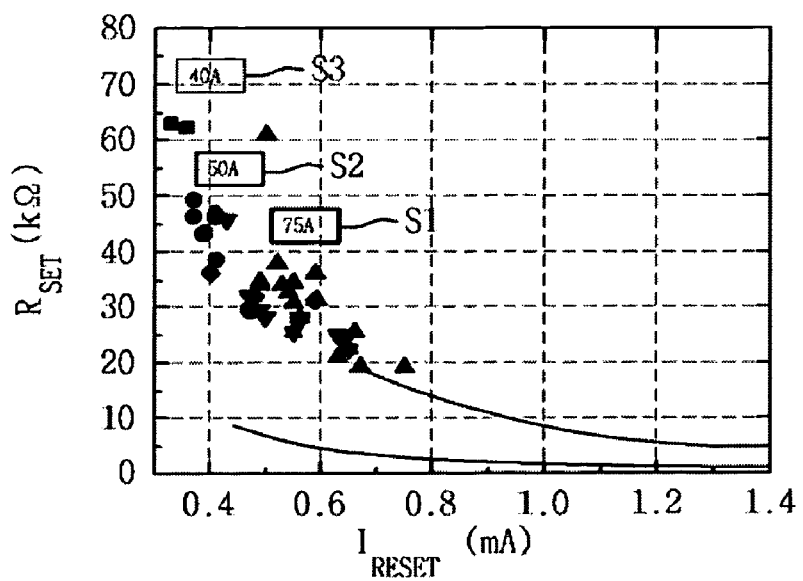
FIG. 3 is a graph illustrating set resistance and reset current results according to the thickness of a bottom electrode contact according to still another exemplary embodiment.

As confirmed from the graph of FIG. 3, when the thickness S1 of the first BEC, the thickness S2 of the second BEC and the thickness S3 of the third BEC are constituted to have the relationship S1>S2>S3, a resistance of the first BEC, a resistance of the second BEC and a resistance of the third BEC are increased in such an order, and a reset current of the first BEC, a reset current of the second BEC and a reset current of the third BEC are decreased in such an order. Therefore, a set operation is performed in the order of the third BEC, the second BEC and the first BEC, depending on the magnitude of the applied current.

While it is not shown, when the first, second and third BEC are formed of conductive materials having different resistivities $\rho$, and a resistivity $\rho1$ of the first BEC, and a resistivity $\rho2$ of the second BEC, and a resistivity ρ3 of the third BEC have the relationship ρ1<ρ2<ρ3, a resistance is increased in the order of the first BEC, the second BEC and the third BEC.

As described above, the memory cell 200 constitutes an MLC storing data D10 and D01 in addition to data D00 and D11 depending on the above-described four resistance levels, and as a result, operating characteristics of two memory cells may be ensured in one memory cell. As a data storage mechanism according to the operating characteristics is observed from a table of FIG. 4, data D00, D01, D10 and D11 are provided by constituting resistance levels as a first resistance Rset1, a second resistance Rset2, a third resistance Rset3 and a reset resistance Rreset.

That is, when all resistances are programmed to a reset state, the reset resistance Rreset becomes 1 MΩ or higher to be data D11. When the third BEC is programmed to a set state, the third resistance Rset3 becomes 100 kΩ to 130 kΩ to be data D10. When the second and third BECs are programmed to a set state, the second resistance Rset2 becomes 50 kΩ to 80 kΩ to be data D01. When all resistances are programmed to a set state, the first resistance Rset1 becomes 10 kΩ to 30 kΩ to be data D00.

Figures 4, 5:
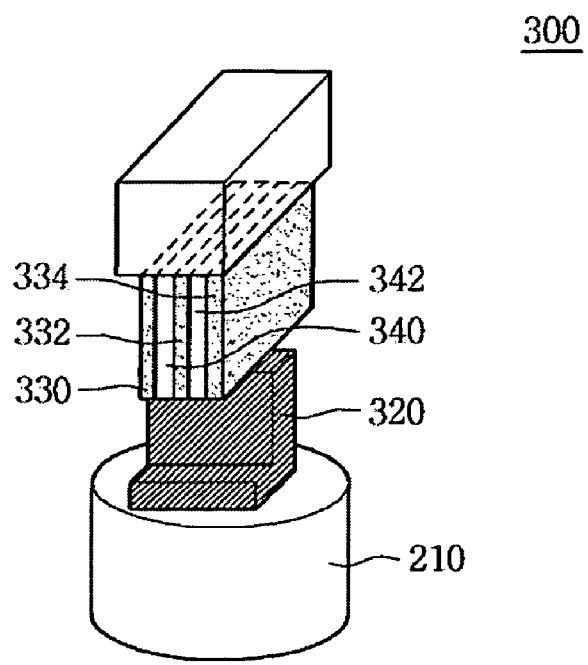
FIG. 4 is a table identifying data depending on a program in a set or reset state according to another exemplary embodiment.
FIG. 5 is a perspective view illustrating a configuration of a semiconductor memory cell in which a plurality of phase-change materials are disposed in parallel according to still another exemplary embodiment.

As illustrated in FIG. 5, a memory cell 300 according to still another exemplary embodiment has a structure in which three or more phase-change materials 330, 332 and 334 separated by an insulator cross over a BEC 320 in a line type to be formed in parallel. Furthermore, since the BEC in a line type crosses the phase-change material in a line type, the BEC is in point contact with the phase-change material. As a result, a reset resistance Rreset and three different set resistances Rset1, Rset2 and Rset3 result in a memory cell structure having four or more different resistances.

Since a set resistance is changed according to a change in phase-change material, a composition ratio or type of the phase-change material is changed to constitute the phase-change material. That is, depending on variations, i.e., different kinds of the phase-change materials, the same kind and different composition ratios or different kinds and compositions ratios, a resistance is changed.

For example, since the phase-change material includes chalcogenide-based elements, i.e., is formed of an alloy of germanium (Ge), antimony (Sb), and tellurium (Te), its properties are changed depending on a composition ratio. In addition, depending on additives, various kinds of the phase-change materials such as Ge—Se—Te, Sn—Se—Te, Sn—Sb—Te, Sn—As—Se, As—Ge—Sb—Te, As—Ge—Se—Te, and Ge—Sb—Se—Te as well as Ge—Sb—Te may be constituted.

As confirmed from the graph of FIG. 6, when a first phase-change material, a second phase-change material and a third phase-change material are composed of LGST, C427GST+Ti, and RGST, respectively, a resistance is increased in the order of the first phase-change material, the second phase-change material and the third phase-change material, and a reset current is decreased in the order of the first phase-change material, the second phase-change material and the third phase-change material. Therefore, a set operation is performed in the order of the third phase-change material, the second phase-change material and the first phase-change material, depending on magnitude of an applied current.

A method of fabricating a memory cell of an MLC configured according to yet another exemplary embodiment and confined in a dash type will be described in detail below with reference to the drawings.

Figure 7A:
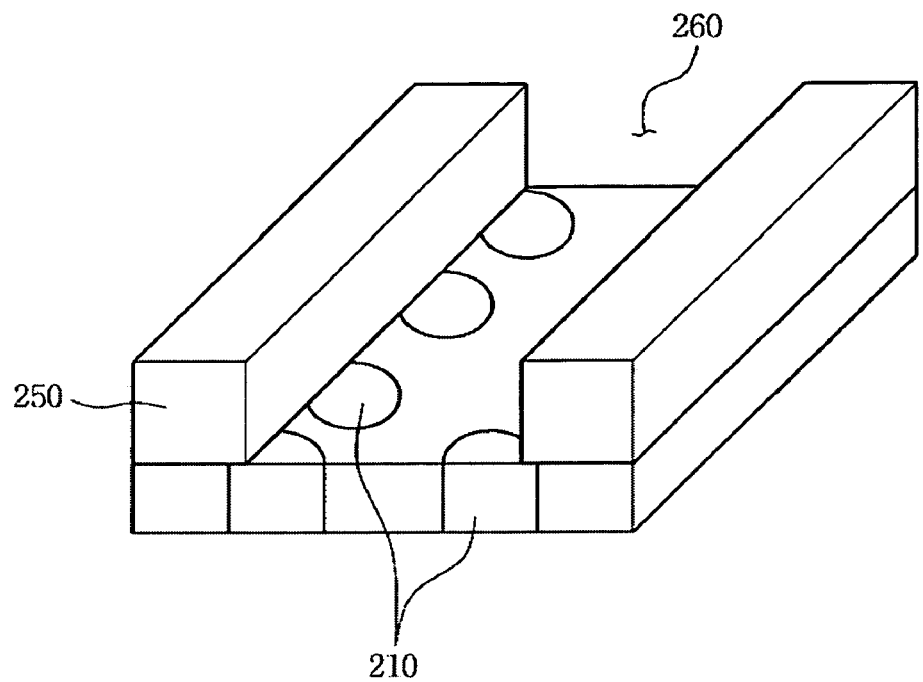
FIGS. 7A to 7I are perspective views illustrating a method of forming a semiconductor memory cell according to another exemplary embodiment.

As illustrated in FIG. 7A, a plurality of single contact plugs 210 are formed. Contact holes exposing a source/drain of a transistor or a diode are formed on an insulator. The same number of contact holes as the number of memory cells may be formed, and a conductive material may fill the contact holes to form the plurality of single contact plugs 210.

A dielectric insulating mold 250 insulating BECs from each other is formed on the single contact plugs 210. The insulating mold 250 is formed by stacking an insulating layer formed of a dielectric material such as $SiO_x$ or $SiO_xN_y$, to etch remaining portions such that the insulating mold 250 partially overlaps the single contact plugs 210 along a plurality of contact lines.

Therefore, a first trench 260 in a longitudinal direction of the contact lines is formed. Here, the insulating mold 250 partially overlaps at least one side of each of the contact plugs 210, and considering that BECs will be formed on the other side of each of the contact plugs, the first trench 260 is formed to expose at least a half or more of each of the contact plugs. Therefore, a plurality of bottom electrode contacts are formed by repeatedly stacking insulators and metal layers on the insulating mold 250 and the first trench 260.

Figure 7B:
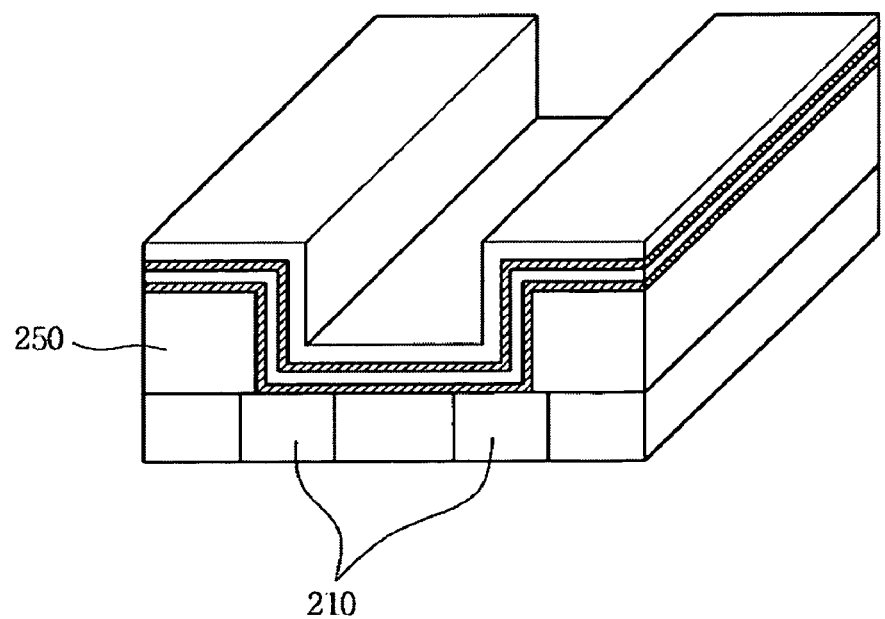

As illustrated in FIG. 7B, first metal layers constituting BECs and first insulating layers insulating the BECs from each other are repeatedly deposited to a uniform thickness on the insulating mold 250 as many times as necessary. When it is desired to form three BECs, a first metal layer, a first insulating layer, a second metal layer and a second insulating layer are sequentially formed.

Figure 7C:
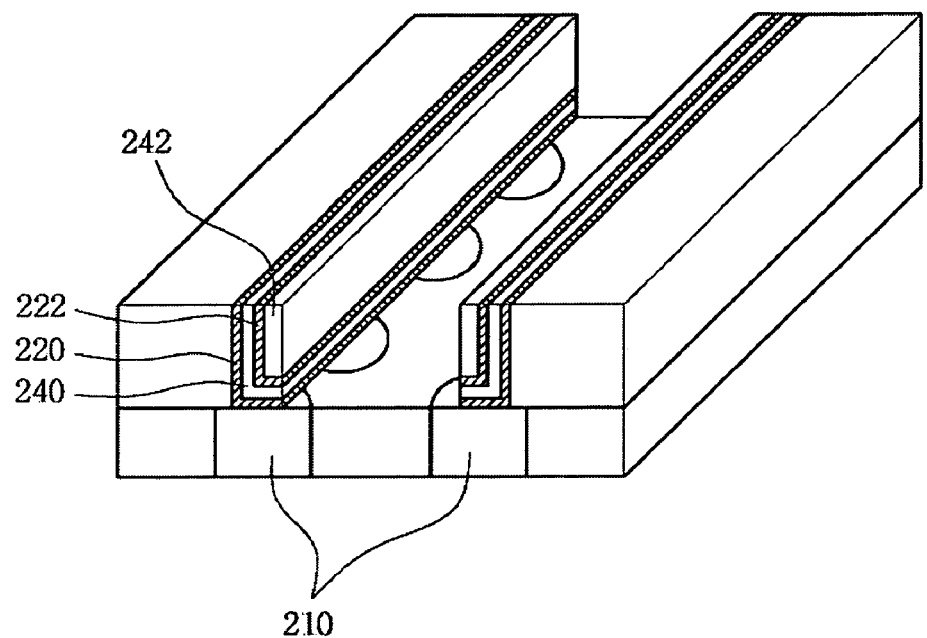

As illustrated in FIG. 7C, an etch-back process is performed to entirely remove a upper horizontal portion of the first and second metal layer and to remove a considerable amount of a lower horizontal portion of the first and second metal layer, so that both ends of the first and second metal layers are exposed. Therefore, first ends of the first and second BECs extending upwardly and the other ends of the first and second BECs extending horizontally are exposed. As a result, a first BEC 220, a first insulator 240, a second BEC 222 and a second insulator 242 are formed.

Figure 7D:
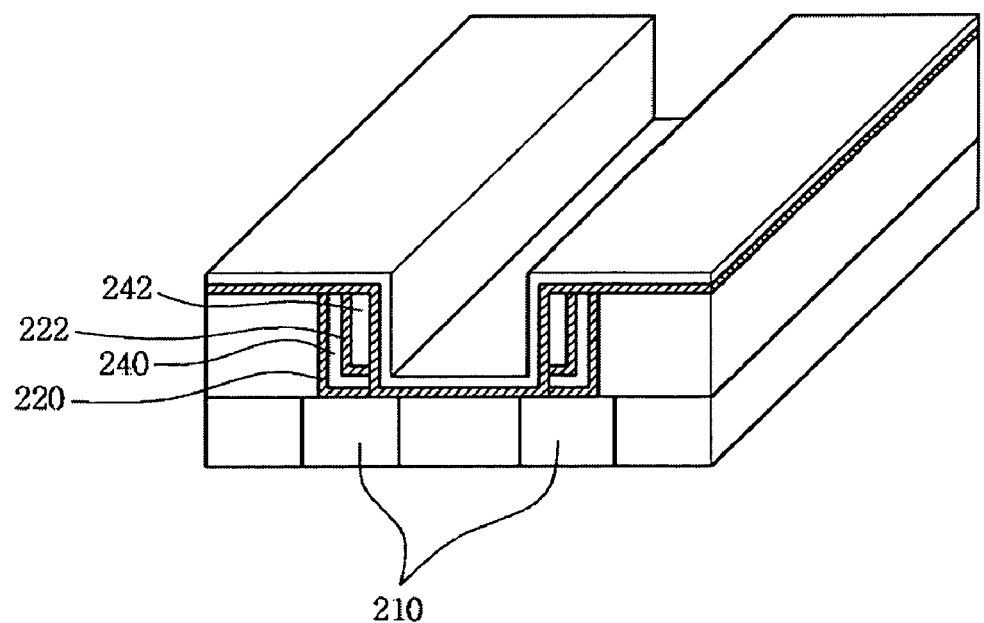

As illustrated in FIG. 7D, a third conductive metal layer and a third insulating layer are coated to a uniform thickness. Likewise, an etch-back process is performed to entirely remove a upper horizontal portion of the third metal layer and to remove a considerable amount of a lower horizontal portion of the third insulating layer.

Figure 7E:
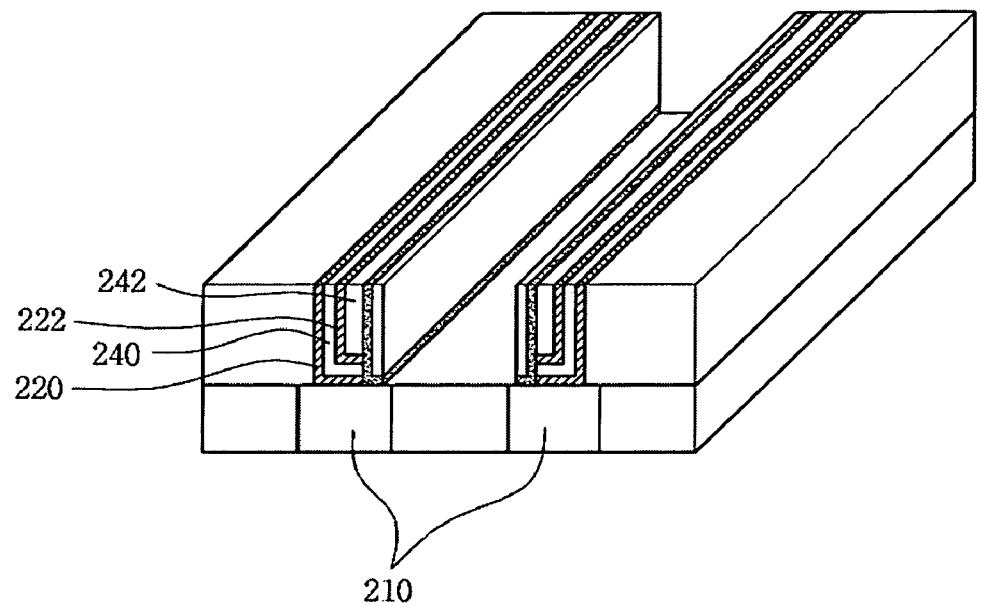

Therefore, as illustrated in FIG. 7E, while the upper end portions of the first, second and third BECs are upwardly exposed, the lower end portions of the first and second BECs are connected to one side of the third BEC, and only a lower end portion of the third BECs is exposed. The first trench 260 formed in a longitudinal direction of the contact lines is filled with a dielectric material such as $SiO_x$ or $SiO_xN_y$, and then a planarization process is performed to polish a surface of the dielectric material.

Figure 7F:
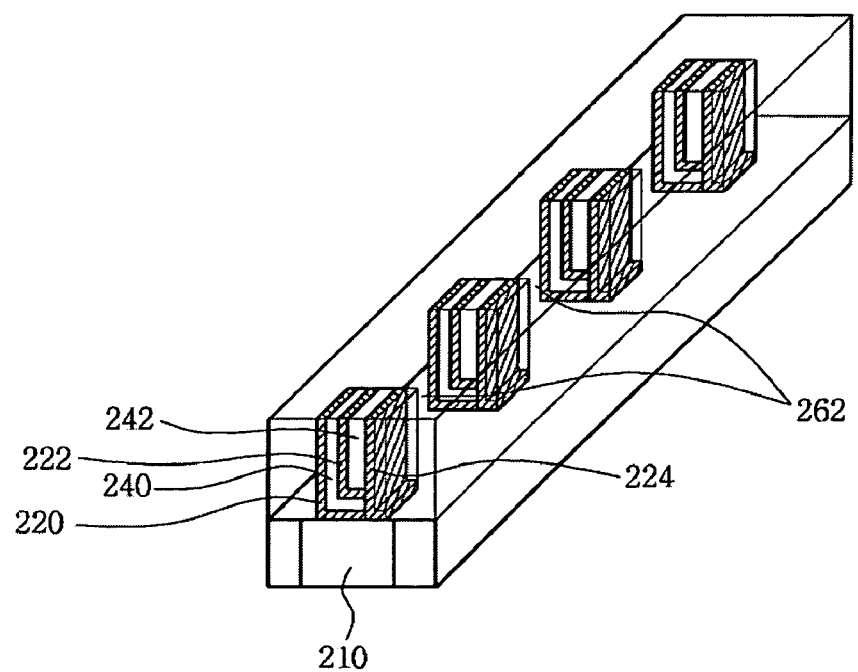

As illustrated in FIG. 7F, a bottom electrode contact and a dielectric material are etched in a horizontal direction of the contact lines to form a second trench 262. A plurality of memory cells are formed by the second trench, and three BECs correspond to one single contact plug 210. Further, the second trench 262 is filled with a dielectric material to insulate the BECs in a horizontal direction. The length and width of the BECs are formed to 50 nm to 60 nm to meet demand for memory cell miniaturization.

Figure 7G:
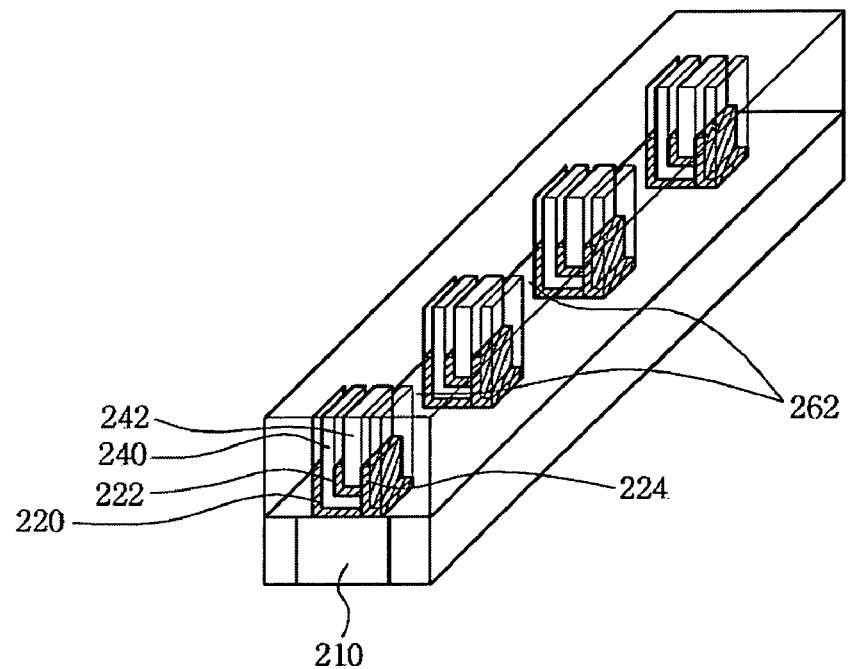
Figure 7H:
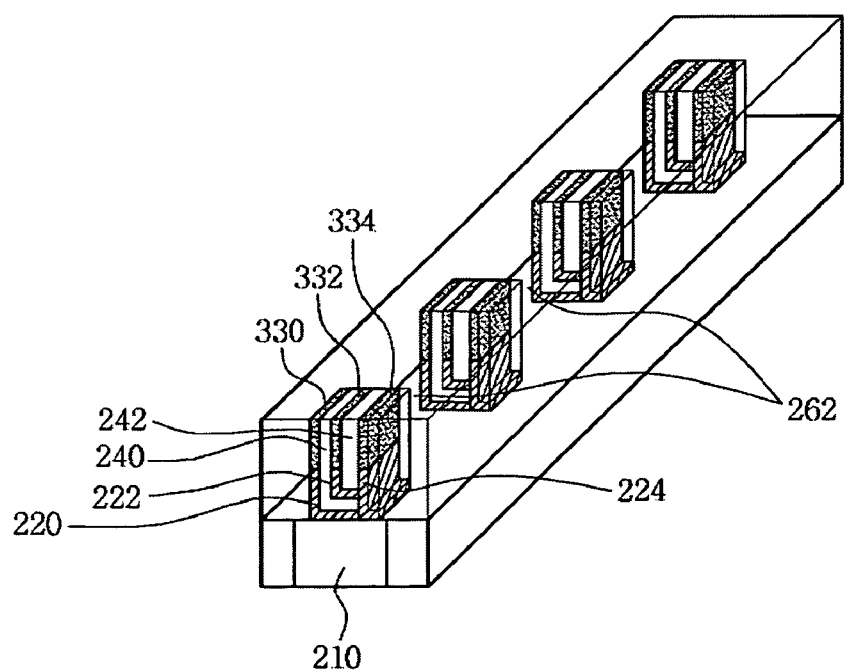
Figure 7I:
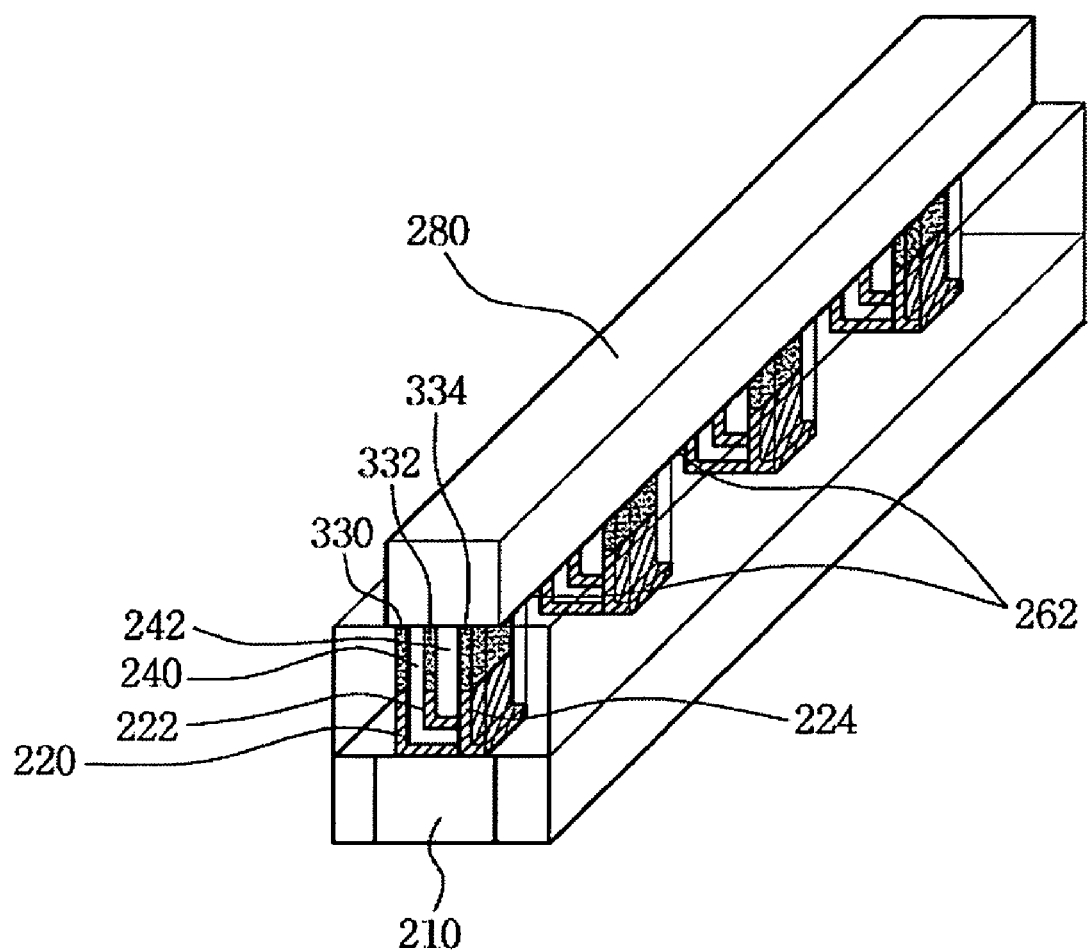

As illustrated in FIG. 7G upper portions of the BECs 220, 222 and 224 are etched-back to form recesses. As illustrated in FIG. 7H, the recesses are filled with the phase-change materials 230, 232 and 234, and a planarization process (CMP) polishing a surface of the upper portion is performed. As illustrated in FIG. 7I, a top electrode contact (TEC) 280 is formed in a strip form in a longitudinal direction of the contact lines on the phase-change material.

Next, a method of fabricating a memory cell 300 of an MLC in which a plurality of line-type phase-change materials cross on line-type bottom electrode contacts according to yet another exemplary embodiment will be described in detail below with reference to the drawings.

Figure 8A:
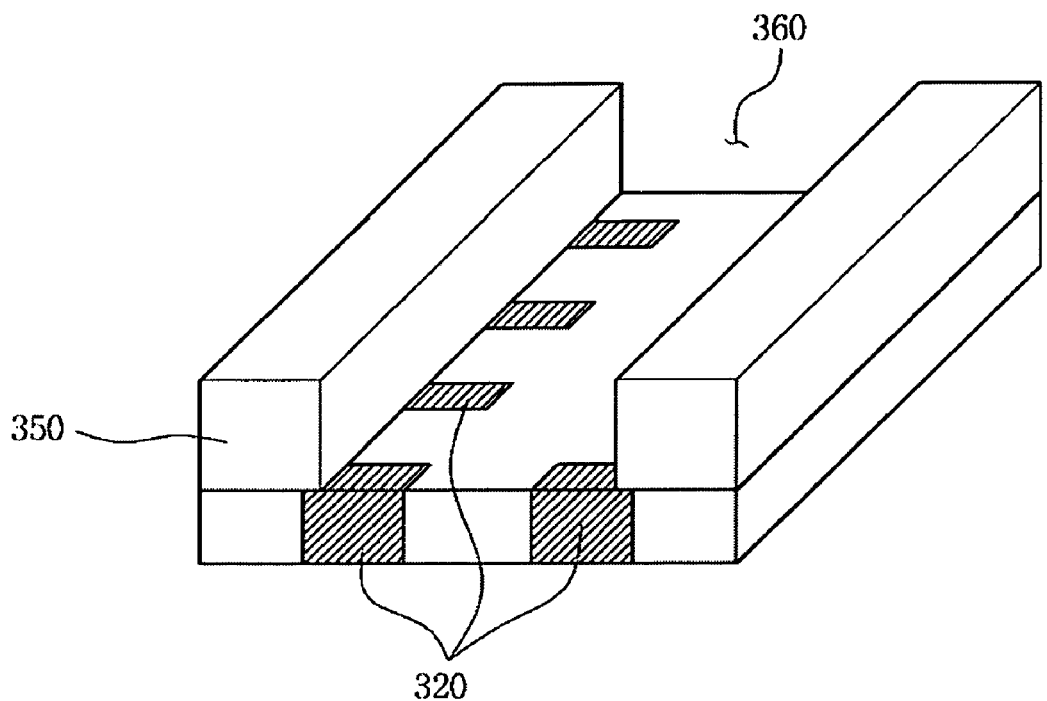
FIGS. 8A to 8H are perspective views illustrating a method of forming a semiconductor memory cell according to still another exemplary embodiment.

As illustrated in FIG. 8A, a plurality of single BECs 320 are formed, an insulating layer formed of a dielectric material such as $SiO_x$ or $SiO_xN_y$, is stacked, and the insulating layer is etched in a longitudinal direction of an electrode line, so that a trench 360 is formed, and insulating molds 350 are fabricated at electrode 2 pitch intervals.

Figure 8B:
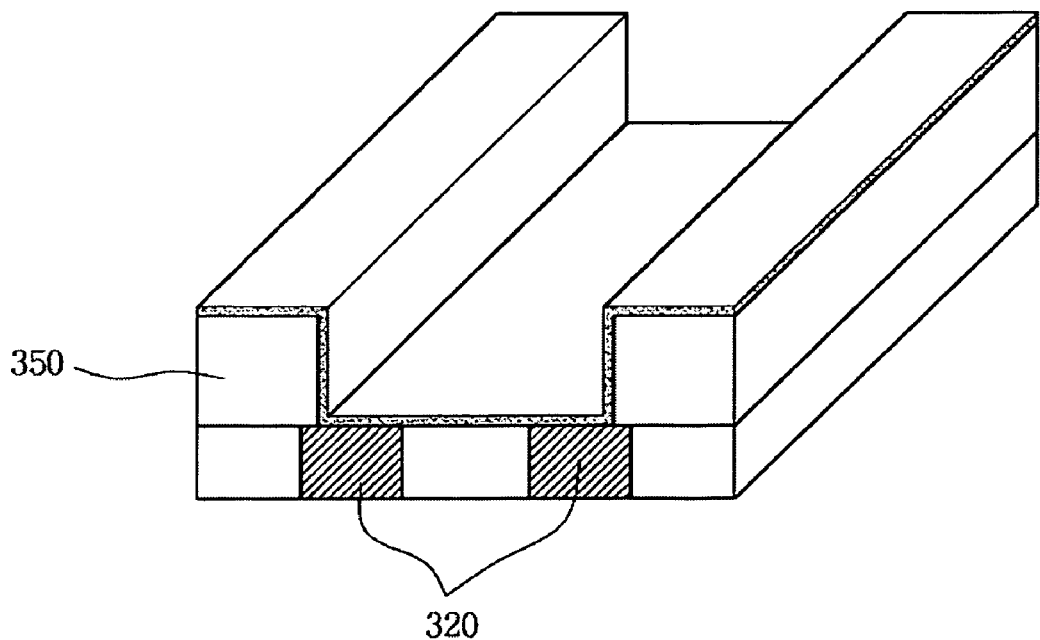

As illustrated in FIG. 8B, a first phase-change material layer constituting a phase-change material is deposited on the bottom electrode contact 320 to a uniform thickness. The deposition may be performed using a physical vapor deposition method, a chemical vapor deposition method or an atomic layer deposition method. When it is desired to form three phase-change materials, a first phase-change material layer, a first insulating layer, a second phase-change material layer, a second insulating layer and a third phase-change material layer are deposited.

Figure 8C:
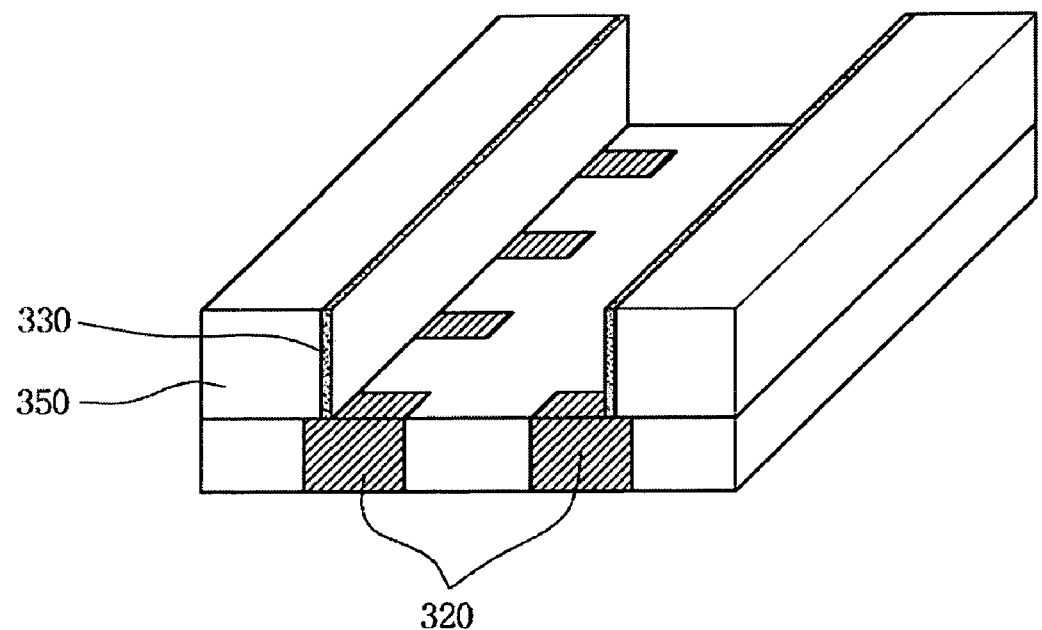
Figure 8D:
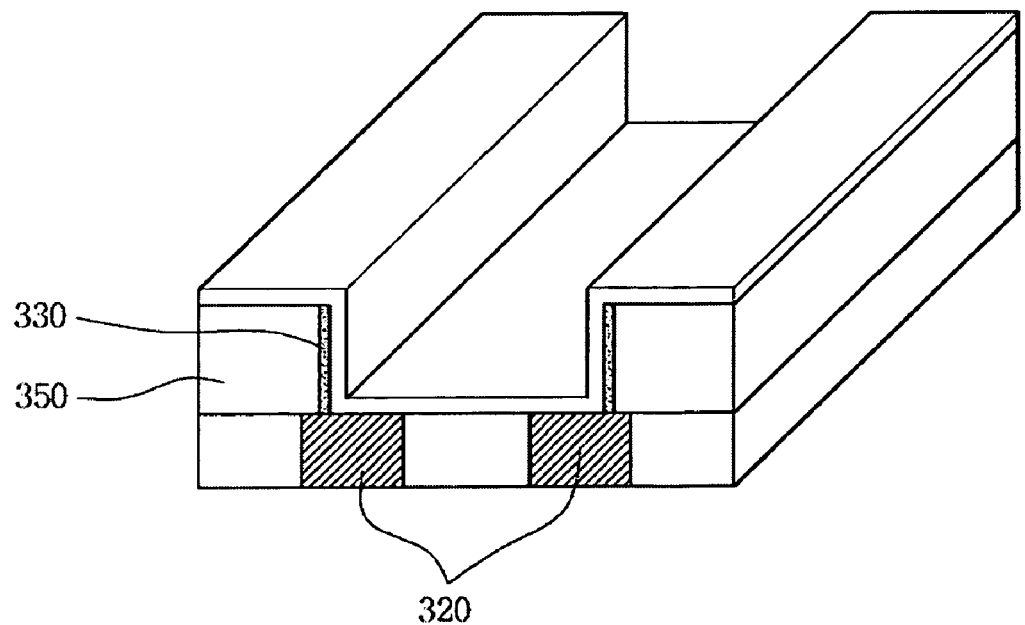
Figure 8E:
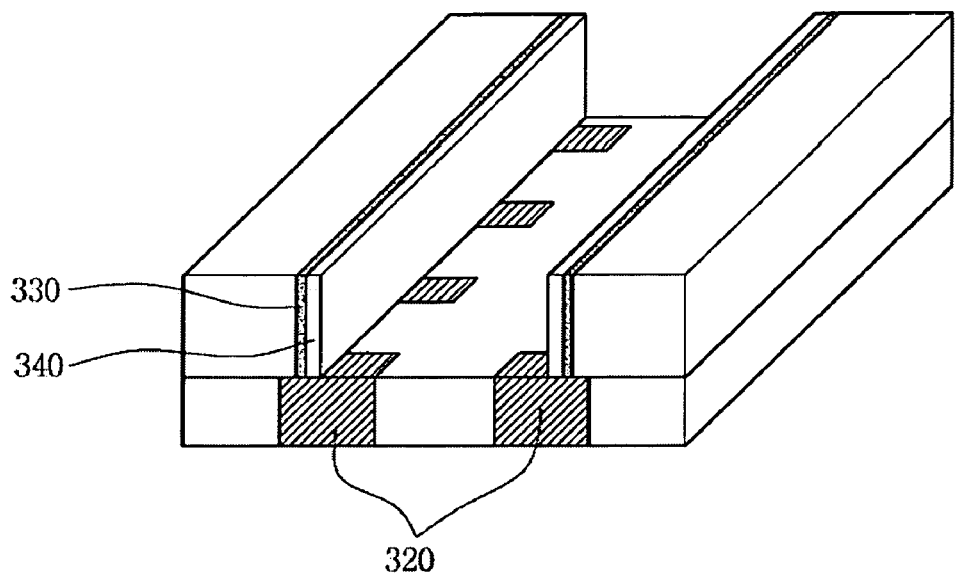

As illustrated in FIG. 8C, the deposited first phase-change material layer is etched-back to remove all portions other than vertical portions. As a result, the first phase-change material 330 is formed. As illustrated in FIG. 8D, the first insulating layer is deposited and the first insulating layer is etched-back, so that other than vertical portions are removed. Thus, as illustrated in FIG. 8E, a first insulator 340 is formed.

Figure 8F:
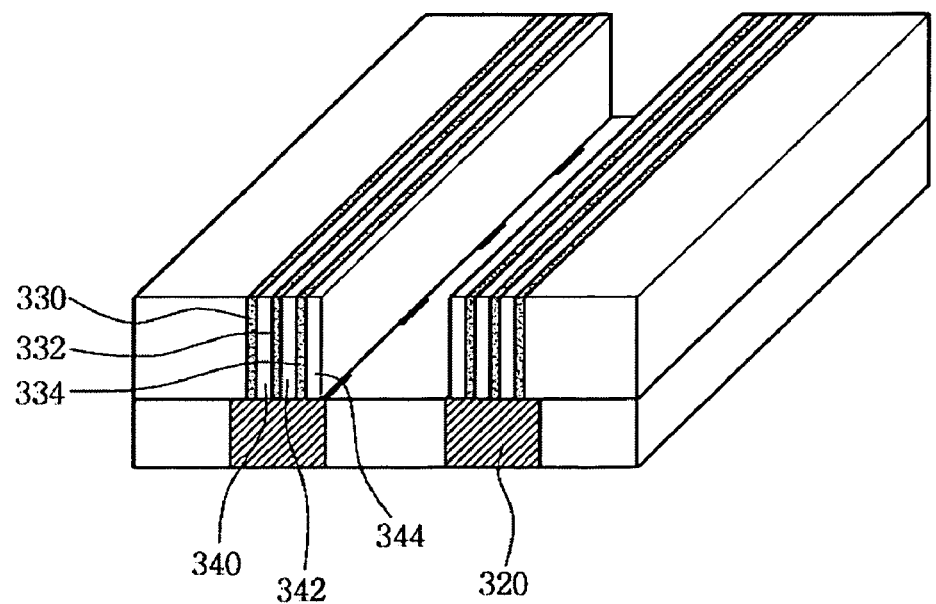
Figure 8G:
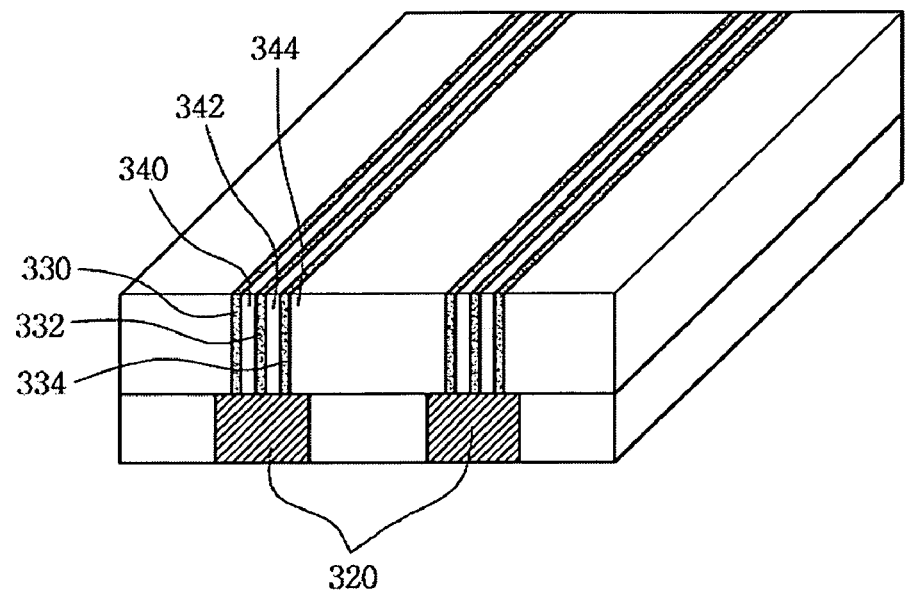
Figure 8H:
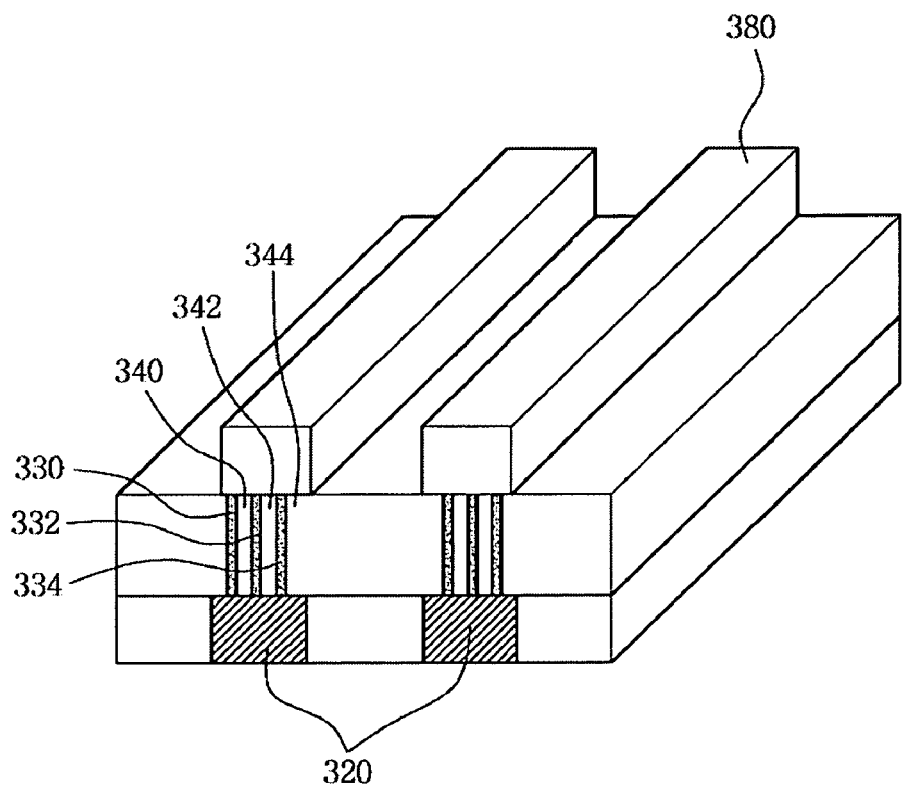

As illustrated in FIG. 8F, when the deposition and etch-back are performed three times, the first phase-change material 330, the first insulator 340, the second phase-change material 332, the second insulator 342, and the third phase-change material 334 are sequentially formed. As illustrated in FIG. 8G, the trench 360 is filled with a dielectric material such as $SiO_x$ or $SiO_xN_y$, and a planarization process (CMP) is performed to polish a surface of the dielectric material. As illustrated in FIG. 8H, a TEC 380 is formed in a strip form on the phase-change material.

As described above, according to the inventive concept, two or more bits of data can be stored in a memory cell, and thus significantly increased integration density of a semiconductor memory anticipates realized. Also, three or more bottom electrode contacts having different thicknesses, lengths and resistivities are formed in parallel in a confined structure on a single contact plug, so that program volumes do not overlap and four more resistance levels are clearly identified. Also, three or more phase-change materials having different composition ratios or types are formed in parallel in a confined structure on a bottom electrode contact, so that a drift phenomenon in which a resistance of an amorphous phase-change material is increased over time can be prevented.

As described above, three or more bottom electrode contacts and phase-change materials having different set resistances that are changed depending on the length, thickness, or resistivity are connected in parallel on a single contact plug or three or more phase-change materials having different set resistances that are changed depending on a composition ratio or a type are connected in parallel on a bottom electrode contact, so that one reset resistance Rreset and three different set resistances Rset1, Rset2 and Rset3 result in four or more different resistances in total. Such variations are not to be regarded as a departure from the spirit and scope of exemplary embodiments of the present application, and all such modifications as would be obvious to one skilled in the art are intended to be included within the scope of the following claims.

What is claimed is:

1. A method of forming a multi-level cell of a semiconductor memory, comprising:
   forming three or more bottom electrode contacts (BECs) in parallel on a contact plug;
   forming three or more phase-change materials (GST) in parallel on the BECs such that the BECs correspond to the phase-change materials, respectively; and
   forming a top electrode contact (TEC) on the phase-change materials,
   wherein forming the three or more phase-change materials includes removing a part of an upper portion of each of the BECs, and filling each space left by the removed parts with a corresponding one of the three or more phase-change materials such that the three or more BECs correspond to the three or more phase change materials, respectively.

2. The method of claim 1, wherein a sidewall of each of the BECs is vertically aligned with a sidewall of the corresponding one of the three or more phase-change materials.

3. The method of claim 1, wherein a horizontal width of each of the BECs is substantially same as a horizontal width of the corresponding one of the three or more phase-change materials.

4. The method of claim 1, wherein forming the BEC and the phase-change materials in parallel includes forming three or more BECs and three or more phase-change materials in parallel on a single contact plug in a confined structure by an insulator, so that two or more bits of data are stored in a memory cell.

5. The method of claim 4, wherein forming the BEC and the phase-change materials in parallel includes forming the BEC and the phase-change materials in a line type, so that a line contact is made between the single contact plug and the BEC, the BEC and the phase-change materials, and the phase-change materials and the TEC.

6. The method of claim 4, wherein forming the BEC and the phase-change materials in parallel includes:
   forming a dielectric insulating mold, at least a part of which overlaps the contact plug, on the single contact plug;
   repeatedly depositing a plurality of metal layers and insulating layers on the insulating mold, and etching-back horizontal portions other than vertical portions, so that a plurality of BECs and insulators are formed in parallel in a line type; and
   recessing an upper portion of the BECs and filling the recessed portions with the phase-change materials.

7. The method of claim 4, wherein the BECs have three or more set resistances and one reset resistance by varying conditions of thickness, length or resistivity, so that a multi-level of four or more resistance levels is formed.

8. A method of forming a multi-level cell of a semiconductor memory, comprising:
   forming a plurality of contact holes exposing a source/drain of a transistor or a diode for a respective plurality of memory cells on an insulator;
   filling the contact holes with a conductive material and forming a plurality of contact plugs;
   depositing an insulating layer on the contact plugs, and forming a first trench in a longitudinal direction in order to form a dielectric insulating mold in the longitudinal direction of the plurality of contact plugs, wherein the dielectric insulating mold overlaps one part of the contact plugs and the first trench exposing another part of the contact plugs;

repeatedly depositing metal layers constituting bottom electrode contacts and insulating layers insulating the bottom electrode contacts from each other on the insulating mold and the trench to a uniform thickness as many times as necessary;

etching-back horizontal portions of the metal layers to expose both ends of vertical portions and horizontal portions of the metal layers respectively, and forming a first BEC, a first insulator, a second BEC and a second insulator;

depositing the final metal layer connected to the plurality of BECs and the final insulating layer sequentially, and etching-back horizontal portions of the final metal layer and the final insulation layer and forming a third BEC and a third insulator;

filling the first trench with a dielectric material, and planarizing a surface thereof;

etching the BECs and the dielectric material in a horizontal direction of the plurality of contact plugs to form a second trench, so that a plurality of memory cells are formed;

filling the second trench with a dielectric material to insulate the plurality of memory cells from each other;

etching-back upper portions of the BECs, and forming recesses;

filling the recesses with phase-change materials, and planarizing a surface; and forming a strip-type top electrode contact in a longitudinal direction of the plurality of contacts on the phase-change materials.

9. A method of forming a multi-level cell of a semiconductor memory, comprising:

forming three or more phase-change materials (GST) insulated by a dielectric material in parallel on a bottom electrode contact; and forming a top electrode contact on the phase-change material, wherein the bottom electrode contact is formed in a line type, the three or more phase-change materials are formed in a line type and are formed in parallel by repeatedly depositing phase-change materials and insulators, and the line-type bottom electrode contact crosses the line-type phase-change materials, so that the bottom electrode contact is in point contact with the phase-change materials.

10. The method of claim 9, wherein the phase-change materials have different set resistances depending on composition ratios or types of the phase-change materials, so that three or more set resistances and one reset resistance form a multi-level, and two or more bits of data are stored in a memory cell.

11. The method of claim 9, wherein forming the phase-change materials in parallel includes:

forming a dielectric insulating mold, at least a part of which overlaps the bottom electrode contact, on the line-type bottom electrode contact, wherein the phase-change materials are formed in a direction crossing the line-type bottom electrode contact;

repeatedly depositing a plurality of phase-change material layers and insulating layers on the insulating mold; and etching-back horizontal portions other than vertical portions to remove the horizontal portions, so that a plurality of phase-change materials and insulators are formed in parallel in a line-type.

* * * * *